(12) United States Patent
Wong

(10) Patent No.: US 6,452,420 B1
(45) Date of Patent: Sep. 17, 2002

(54) MULTI-DIMENSIONAL DIFFERENTIAL SIGNALING (MDDS)

(75) Inventor: Hee Wong, San Jose, CA (US)

(73) Assignee: National Semiconductor Corporation ( * ) Notice: Subject to any disclaimer, the term of this patent is extended or adjusted under 35 U.S.C. 154(b) by 0 days.

(21) Appl. No.: 09/865,162

(22) Filed: May 24, 2001

(51) Int. Cl.[7] .............................................. H03K 17/16
(52) U.S. Cl. ............................ 326/86; 326/90; 326/30; 710/101; 710/126; 375/257
(58) Field of Search .............................. 326/82, 86, 90, 326/30; 710/101, 126; 375/257

(56) References Cited

U.S. PATENT DOCUMENTS

| | | | | |
|---|---|---|---|---|
| 4,631,428 A | * | 12/1986 | Grimes | 307/475 |
| 5,604,450 A | * | 2/1997 | Borkar et al. | 326/82 |
| 6,208,161 B1 | * | 3/2001 | Suda | 326/30 |
| 6,226,330 B1 | * | 5/2001 | Mansur | 375/257 |

OTHER PUBLICATIONS

Engineering Formulas, 6th Edition, Kurt & Reiner Gieck, Electrical Engineering, S10.*

* cited by examiner

*Primary Examiner*—Michael Tokar
*Assistant Examiner*—Vibol Tan
(74) *Attorney, Agent, or Firm*—Merchant & Gould P.C.; Timothy P. Sullivan

(57) ABSTRACT

A multi-dimensional differential signaling (MDDS) system is provided. A current loop is formed between N different communication lines and a corresponding differential is produced by loads coupled between the communication lines. The MDDS system may be two-dimensional or multi-dimensional. The number of communications lines chosen for the MDDS system affects the number of differential pairs in the system as well as the bits of information that may be transmitted. More than two states are provided by the MDDS system. For example, if three communication lines are used within the system, six states are provided. A star or delta load is used to produce the differential across the communication lines.

20 Claims, 8 Drawing Sheets

| Communication Lines | Differential Pairs | States | Bits | Bits per 2 communication lines |
|---|---|---|---|---|
| 2 | 1 | 2 | 1.00 | 1.00 |
| 3 | 3 | 6 | 2.58 | 1.72 |
| 4 | 6 | 12 | 3.58 | 1.79 |
| 5 | 10 | 20 | 4.32 | 1.73 |
| 6 | 15 | 30 | 4.91 | 1.64 |
| 7 | 21 | 42 | 5.39 | 1.54 |
| 8 | 28 | 56 | 5.81 | 1.45 |
| 9 | 36 | 72 | 6.17 | 1.37 |

*Fig.9*

MULTI-DIMENSIONAL DIFFERENTIAL SIGNALING (MDDS)

FIELD OF THE INVENTION

The present invention is related to differential signaling techniques, and more specifically to differential signaling for electronic circuits.

BACKGROUND OF THE INVENTION

Differential signaling has been in existence for many years. For example, teletypes were some of the first equipment to use differential signaling to communicate. One common technique of differential signaling utilizes a current loop to send and receive information between a receiver and transmitter.

According to this differential signaling technique, current is sent in one direction around the loop or the other direction around the loop to represent information. A pulse of current on the loop may correspond to a logic value of "1", while no current may correspond to a logic value of "0."

Current loops have several advantages over other signaling techniques. For example, data sent utilizing a current loop can travel further than data sent through a common RS-232 interfaces. Current loop differential signaling techniques also provide protection against electrical interference. Additionally, current loop differential signaling techniques can reliably make connections when other communication techniques cannot.

One type of a current loop differential signaling technique is Low Voltage Differential Signaling (LVDS). LVDS is a differential signaling technique commonly used in data transmission systems. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

Electronic devices (i.e. computers) often have a local port that is a connection terminal for a remote port. When a remote port is connected to the local port, the local port is initialized to recognize the remote port. After initialization, the remote port and the local port can exchange information. The communication between the ports is often done by means of LVDS driver and receiver pairs.

SUMMARY OF THE INVENTION

Briefly described, the present invention is directed at providing a multi-dimensional differential signaling (MDDS) system.

According to one aspect of the invention, an MDDS system includes N communication lines. The MDDS system may be two-dimensional or multi-dimensional. For example, the system may include three communication lines forming three differential pairs. The number of communications lines chosen for the MDDS system affects the number of differential pairs in the system as well as the bits of information that may be transmitted.

According to another aspect of the invention, more than two states are provided by the MDDS system. For example, if three communication lines are used within the MDDS system, six states are provided. If twelve states are desired then four communication lines may be implemented in the MDDS system.

According to another aspect of the invention, a load to provide the differential across the communication lines is provided by a star or a delta load.

BRIEF DESCRIPTION OF THE DRAWINGS

FIG. 9 shows an exemplary table illustrating the number of communication lines and the information that may be transmitted over the communication lines.

DETAILED DESCRIPTION OF THE PREFERRED EMBODIMENT

Figure 1:
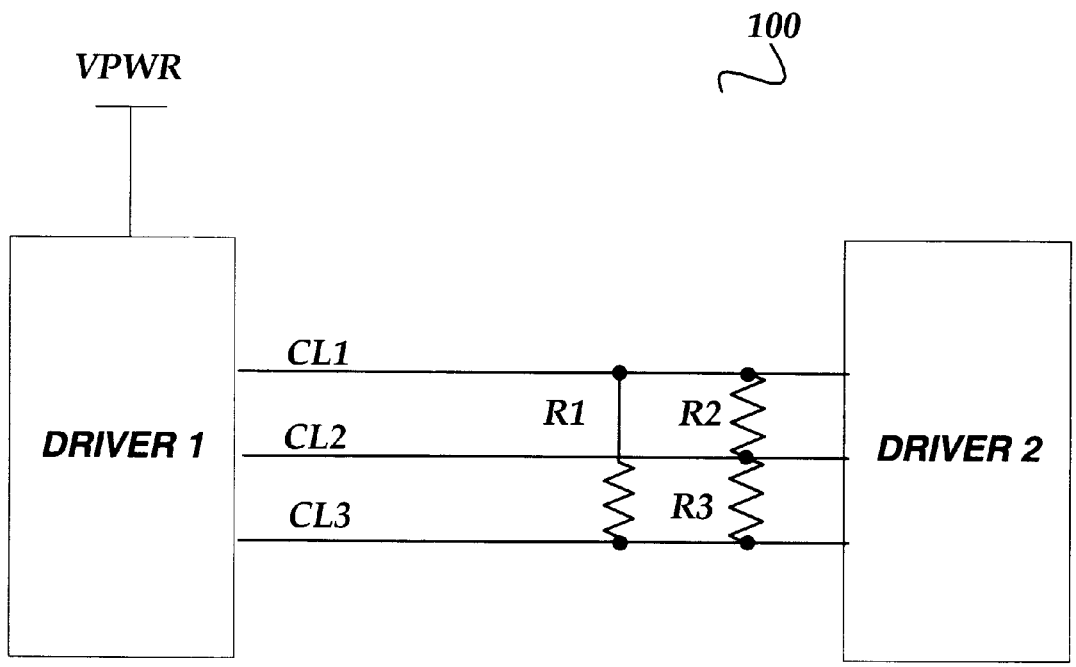
FIG. 1 shows an overview schematic diagram of a multi-dimensional differential signaling system including three communication lines.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

Briefly described, the present invention is directed at providing a multi-dimensional differential signaling (MDDS) apparatus and method that communicates information.

FIG. 1 shows an overview of an MDDS system using three communication lines, according to one embodiment of the invention. As shown in the figure, MDDS system 100 includes DRIVER 1, DRIVER 2, loads R1, R2, and R3, and communication lines CL1, CL2, and CL3.

Power supply signal VPWR is coupled through switch SW1 (not shown) to provide a local power supply signal to DRIVER 1. DRIVER 1 is coupled to DRIVER 2 through communication lines CL1, CL2, and CL3. Load R1 is coupled between communication line CL1 and communication line CL3. Load R2 is coupled between communication line CL1 and communication line CL2. Load R3 is coupled between communication line CL2 and communication line CL3.

DRIVER 1 and DRIVER 2 communicate over communication lines CL1, CL2, and CL3. Loads R1, R2 and R3 produce a differential signal corresponding to the communication lines used to transmit information in the MDDS system. For example, when communication lines CL1 and CL3 are used a corresponding differential signal is produced by load R1. Similarly, when communication lines CL2 and CL3 are used a corresponding differential signal is produced by load R3. The signal generated by DRIVER 1 may travel out one communication line (CL1, CL2, or CL3) and may travel back any other communication line.

DRIVER 1 may be configured as a transmitter, a receiver, or a transmitter and a receiver. Similarly, DRIVER 2 may be configured as a receiver, a transmitter, or a transmitter and a receiver.

Figure 2:
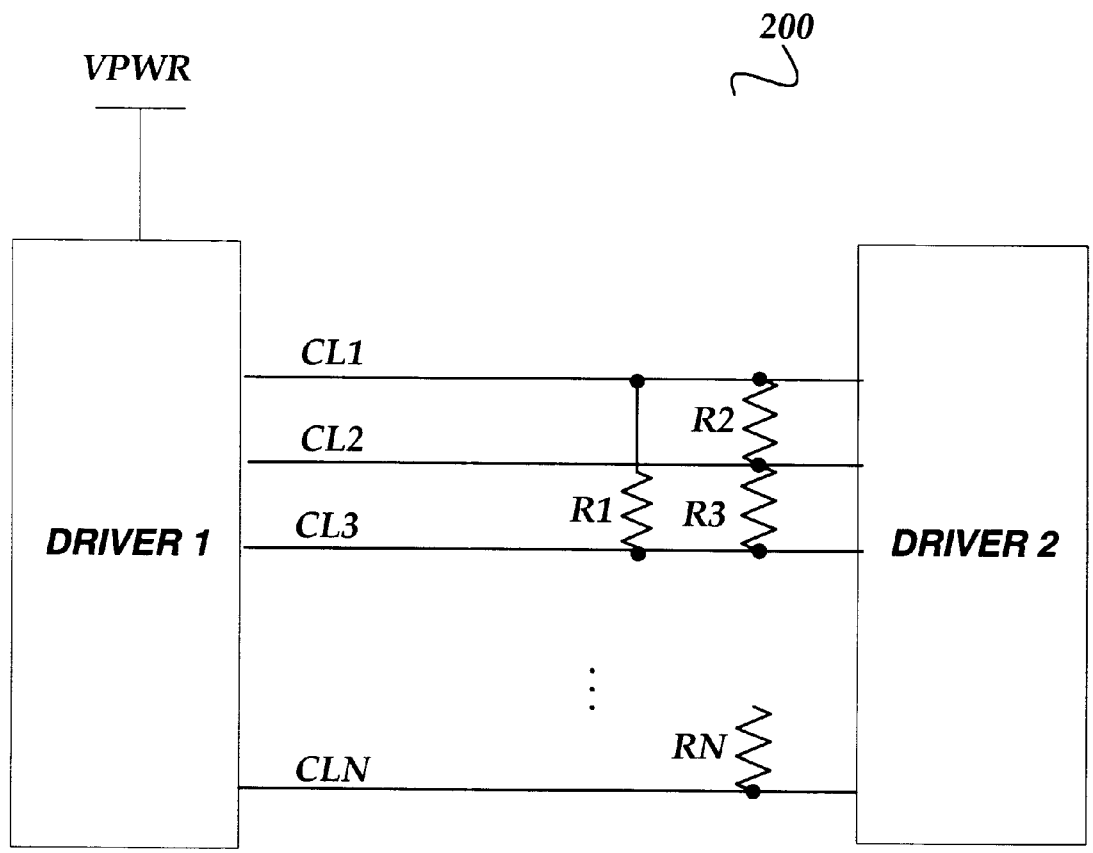
FIG. 2 illustrates a schematic diagram of a multi-dimensional differential signaling system including N communication lines.

FIG. 2 shows an overview of an MDDS system including N communication lines, according to one embodiment of the invention. As shown in the figure, MDDS system 200 includes DRIVER 1, DRIVER 2, loads R1–RN, and communication lines CL1–CLN.

The MDDS system shown in FIG. 2 is substantially similar to the MDDS system shown in FIG. 1. In this particular embodiment, however, N communication lines are provided. The number of communication lines may be chosen based on the desired operating characteristics of the MDDS system. For example, the number of communication lines may be chosen based on the number of desired states.

Figure 3:
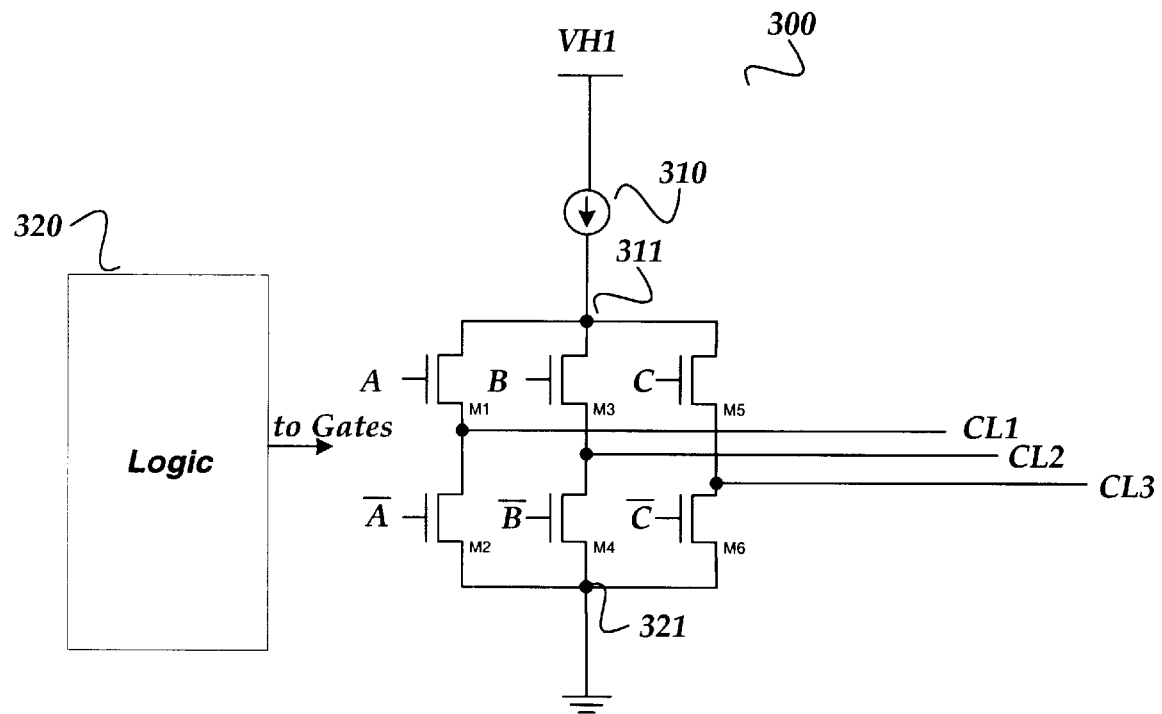
FIG. 3 shows a schematic diagram of an MDDS transmitter including three communication lines.

FIG. 3 shows a schematic diagram of a transmitter in an MDDS system using three communication lines, according to one embodiment of the invention. As shown in the figure, transmitter 300 includes six transistors M1, M2, M3, M4, M5 and M6, logic circuit 320, and communication lines CL1, CL2, and CL3.

Current source 310 provides a current from local power supply VHI to node 311 in response to the bias control signal (not shown). Transistor M1 has a gate connected to data signal A, a source connected to node 311 and a drain connected to communication line CL1. Transistor M2 has a gate connected to data signal $\overline{A}$, a source connected to node 321 and a drain connected to communication line CL1. Transistor M3 has a gate connected to data signal B, a source connected to node 311 and a drain connected to communication line CL2. Transistor M4 has a gate connected to data signal $\overline{B}$, a source connected to node 321 and a drain connected to communication line CL2. Transistor M5 has a gate connected to data signal C, a source connected to node 311 and a drain connected to communication line CL3. Transistor M6 has a gate connected to data signal $\overline{C}$, a source connected to node 321 and a drain connected to communication line CL1.

Logic circuit 320 controls the enablement of transistors M1–M6. Transistors M1–M6 are enabled depending on the communication lines used. For example, to produce a differential signal that travels out on communication line CL1 and travels back on communication line CL3, logic circuit 320 enables transistor M1 and M6. Similarly, to produce a differential signal across communication line CL2 and CL3, logic circuit 320 enables transistor M3 and transistor M6. Alternatively, the signal may travel in the opposite direction, in which case the polarity will change but the value will be maintained.

Although transistors M1–M6 are shown as P-channel and N-channel devices, transistors M1–M6 may be Bipolar devices, P-channel MOS devices, N-channel MOS devices, GaAsFET devices, JFET devices, as well as one or more components that are arranged to provide the function of transistors M1–M6 in the above described example.

Figure 4:
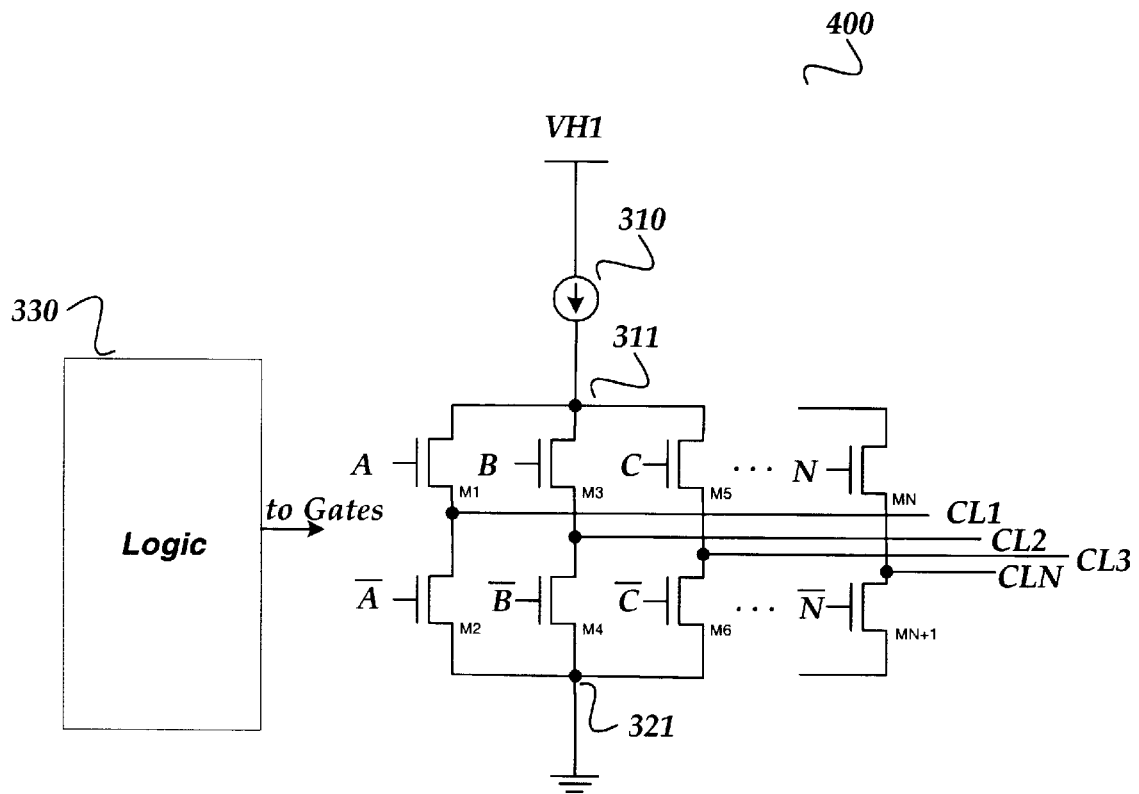
FIG. 4 shows a schematic diagram of an MDDS transmitter including N communication lines.

FIG. 4 shows a schematic diagram of a transmitter in an MDDS system using N communication lines, according to one embodiment of the invention. As shown in the figure, transmitter 400 includes N transistor pairs M1-MN, logic circuit 330, and N communication lines CL1-CLN.

The transmitter shown in FIG. 4 is substantially similar to the transmitter shown in FIG. 3 but includes N communication lines. The number of communication lines chosen may change depending on the particular operating characteristics desired.

Figure 5:
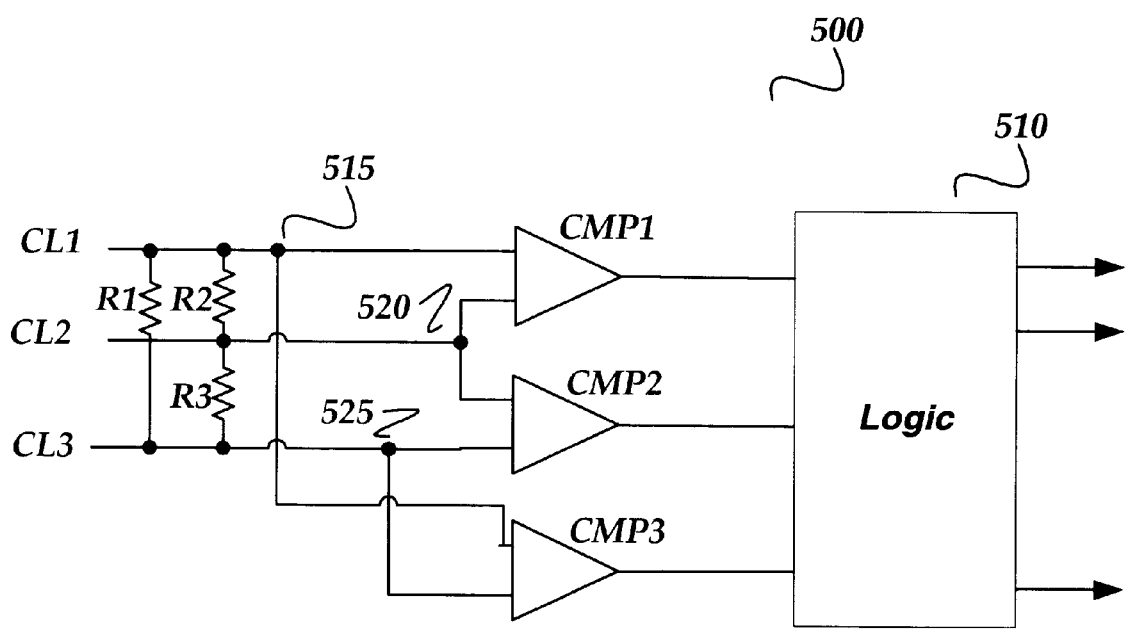
FIG. 5 shows a schematic diagram of a receiver for an MDDS system using three communication lines.

FIG. 5 shows a schematic diagram of a receiver for an MDDS system using three communication lines, according to one embodiment of the invention. As shown in the figure, receiver 500 includes loads R1, R2, and R3, comparators CMP1, CMP2, and CMP3, and logic circuit 510.

Figure 7:
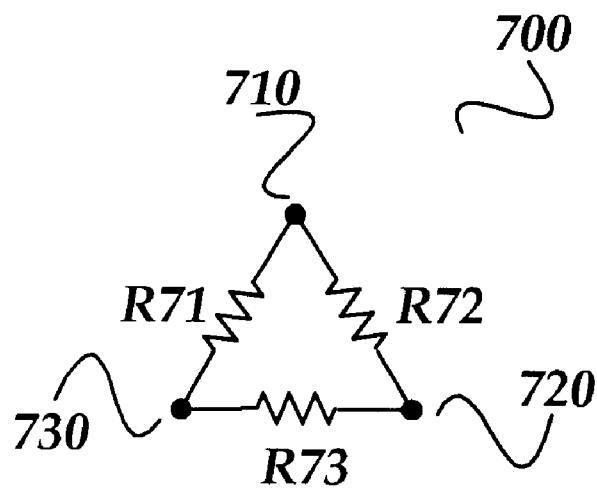
FIG. 7 shows a schematic diagram of a star load used in an MDDS system.
Figure 8:
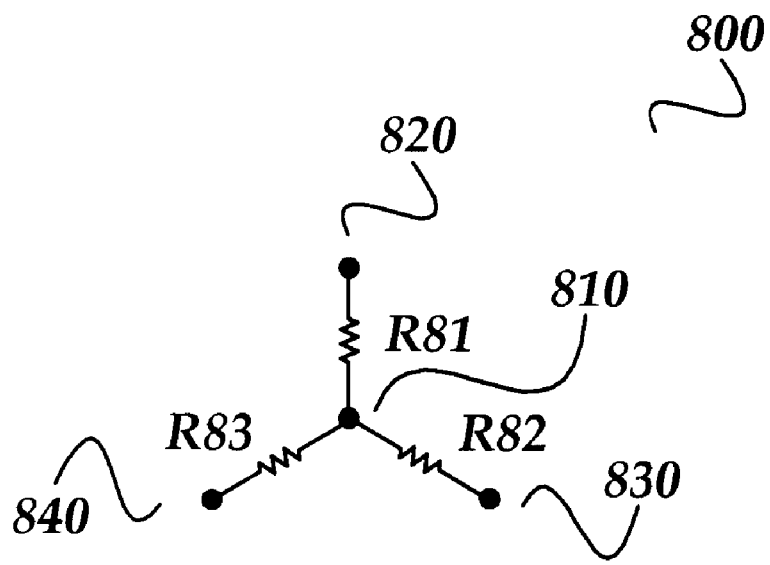
FIG. 8 illustrates a schematic diagram of a delta load used in an MDDS system, according to one embodiment of the invention.

Loads R1, R2 and R3 are coupled between communication lines CL1, CL2, and CL3 (See FIGS. 7 and 8 for exemplary load configurations). According to one embodiment, load R1 is coupled between node 515 and node 525. Load R2 is coupled between node 515 and node 520, and load R3 is coupled between node 520 and node 525. The common point between the resistors may be connected to another local power supply signal (not shown), which sets up a common mode voltage for a differential signal that appears between any combination of the communication lines CL1, CL2, and CL3.

CMP1 has an input coupled to node 515 and an input coupled to node 520. CMP2 has an input coupled to node 520 and an input coupled to node 525. CMP3 has an input coupled to node 515 and an input coupled to node 525. The comparators are responsive to a differential signal that appears across the load (R1, R2, and R3) at nodes 515, 520, and 525. Logic circuit 510 receives the outputs of comparators CMP1, CMP2, and CMP3. An output signal is differentially provided across the loads at nodes 515, 520, and 525.

Figure 6:
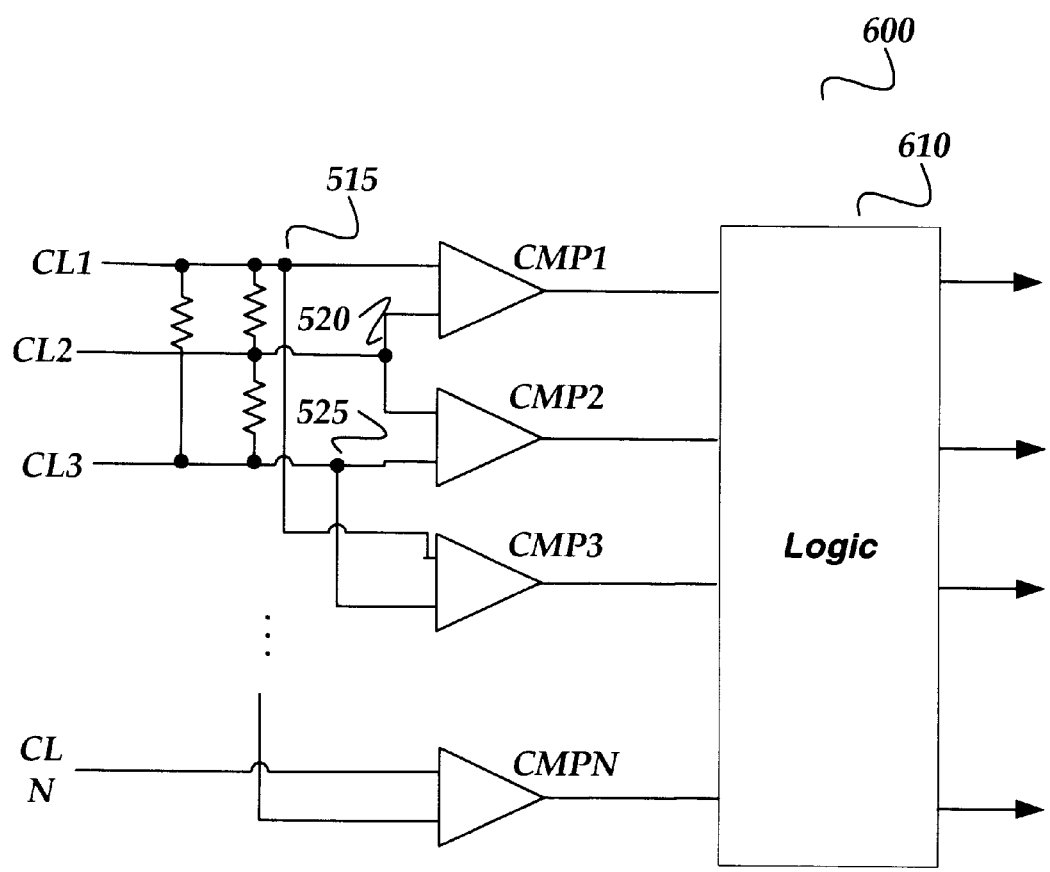
FIG. 6 shows a schematic diagram of a receiver for an MDDS system using N communication lines.

FIG. 6 shows a schematic diagram of a receiver for an MDDS system using N communication lines, according to one embodiment of the invention. As shown in the figure, receiver 600 includes loads R1-RN, comparators CMP1–CMPN, and logic circuit 610. The receiver shown in FIG. 6 is substantially similar to the receiver shown in FIG. 5, but includes the ability to receive a differential signal across N communication lines.

FIG. 7 illustrates an exemplary delta load that may be used as a load in an MDDS system, according to one embodiment of the invention. As shown in the figure, exemplary delta load 700 includes resistors R71, R72, and R73. Resistors R71–R73 are arranged in a delta (triangle) pattern. Resistor R71 is coupled between node 710 and node 730. Resistor R72 is coupled between node 710 and node 720. Resistor R73 is coupled between node 720 and node 730. Nodes 710, 720, and 730 may be coupled to communication lines CL1, CL2, and CL3, respectively (See figures above) to produce a differential signal.

FIG. 8 illustrates an exemplary star load that may be used as a load in an MDDS system, according to one embodiment of the invention. As shown in the figure, exemplary star load 700 includes resistors R81, R82, and R83. Resistors R81–R83 are connected in a star pattern. More specifically, resistors R81–R83 share a common point at node 810. R81 is coupled between node 810 and node 820. R82 is coupled between node 810 and node 830, and R83 is coupled between node 810 and node 840. Nodes 820, 830, and 840 may be coupled to communication lines CL1, CL2, and CL3, respectively (See figures above) to produce a differential signal.

FIG. 9 shows an exemplary table illustrating the number of communication lines and the information that may be transmitted over the communication lines. As shown in the figure, the table includes headings for number of communication lines, differential pairs, states, bits, and bits per two communication lines. As can be seen by referring to FIG. 9, the number of states increase rapidly as the number of communication lines increase, but the number of bits per two communication lines does not increase at the same rate. It can be seen that four communication lines provides the highest number of bits per two wires.

As will be appreciated in view of the present disclosure, the number of wires chosen to implement within the MDDS technique must be balanced against many factors. These factors include amount of information to transmit or receive as well as the space available for the extra communication lines. According to one embodiment of the invention, three communication lines are used to provide a balance between the bulk of the communication lines and associated circuitry and the amount of information that may be represented.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for multi-dimensional differential signaling that provides at least six states, comprising:
   three communication lines that provide at least six states, wherein any combination of at least two of the three communication lines may form a signal path for a signal to travel on;
   a transmitter circuit arranged to produce the signal that travels on the signal path;
   a load circuit arranged to produce a differential signal in response to the signal path for the signal; and
   a receiver circuit arranged to be responsive to the differential signal.

2. The apparatus of claim 1, wherein the three communication lines form free differential pairs and six states.

3. The apparatus of claim 1, wherein the load circuit is a star load having three nodes coupled to the three communication lines.

4. The apparatus of claim 1, wherein the load circuit is a delta load having three nodes coupled to the three communication lines.

5. The apparatus of claim 1, wherein the load circuit further comprises a plurality of loads.

6. The apparatus of claim 5, wherein the plurality of loads is coupled to each pair of the three communication lines.

7. The apparatus of claim 5, wherein each of the plurality of loads is a delta load or a star load.

8. The apparatus of claim 1, further comprising a transmitter logic circuit arranged to control the transmitter circuit.

9. The apparatus of claim 8, wherein the transmitter circuit further comprises a plurality of transistors arranged to produce the signal.

10. The apparatus of claim 9, wherein the transmitter logic circuit is arranged to enable the plurality of transistors arranged to produce the signal.

11. The apparatus of claim 10, wherein the plurality of transistors arranged to produce the signal further comprises coupling the three communication lines to the plurality of transistors.

12. The apparatus of claim 1, wherein the receiver circuit further comprises, a comparator circuit arranged to be responsive to the differential signal.

13. The apparatus of claim 12, wherein the comparator circuit further comprises three comparators, each of the three comparators arranged to monitor each pair of the three communication lines.

14. An apparatus for multi-dimensional differential signaling that provides at least three differential pairs and at least six states, comprising:
   N communication lines that provide at least six states, wherein any combination of the N communication lines may form a signal path for a signal to travel on;
   a first driver circuit arranged to produce the signal that travels out on one of the N communication lines and travels back on a different one of the N communication lines from which the signal traveled out on;
   a load circuit arranged to produce a differential signal in response to the signal; and
   a second driver circuit arranged to be responsive to the differential signal.

15. The apparatus of claim 14, further comprising a transmitter logic circuit arranged to control the first driver circuit.

16. The apparatus of claim 15, wherein the first driver circuit further comprises a plurality of transistors arranged to produce the signal.

17. The apparatus of claim 16, wherein the load circuit is a delta load circuit or a star load circuit.

18. The apparatus of claim 17, wherein the second driver circuit further comprises, a comparator circuit arranged to be responsive to the differential signal.

19. A method for multi-dimensional differential signaling that provides at least three differential pairs and at least six states, comprising:
   producing a signal from a transmitter that travels to a receiver on one of three communication lines, wherein the three communication lines provide at least six states;
   producing a differential signal in response to the signal;
   receiving the differential signal at a receiver and responding to the differential signal; and
   transmitting the signal back to the transmitter on any one of the communication lines that is different from the communication line that the signal traveled to the receiver on.

20. An apparatus for multi-dimensional differential signaling that provides at least three differential pairs and at least six states, comprising:
   a means for producing a signal that travels on at least two of three communication lines;
   wherein any two of the three communication lines may be used for the signal path and the three communication lines provide at least six states;
   a means for producing a differential signal in response to the signal; and
   a means for receiving the differential signal; and
   a means for being responsive to the differential signal.

* * * * *

UNITED STATES PATENT AND TRADEMARK OFFICE
CERTIFICATE OF CORRECTION

PATENT NO.    : 6,452,420 B1                                    Page 1 of 1
DATED         : September 17, 2002
INVENTOR(S)   : Hee Wong It is certified that error appears in the above-identified patent and that said Letters Patent is hereby corrected as shown below:

<u>Column 1,</u>
Line 47, "...lines form free differential pairs..." should read -- ...lines form three differential pairs... --

Signed and Sealed this

Sixteenth Day of September, 2003

JAMES E. ROGAN
*Director of the United States Patent and Trademark Office*